United States Patent

Schneider

[11] 4,038,647
[45] July 26, 1977

[54] METHOD FOR HOLOGRAPHIC STORAGE
[75] Inventor: Irwin Schneider, Alexandria, Va.
[73] Assignee: The United States of America as represented by the Secretary of the Navy, Washington, D.C.
[21] Appl. No.: 659,058
[22] Filed: Feb. 18, 1976
[51] Int. Cl.² .................... G11C 11/32; G11C 13/04
[52] U.S. Cl. ........................ 340/173 CC; 350/160 P
[58] Field of Search ............ 340/173 CC; 350/160 R, 350/160 P

[56] References Cited

U.S. PATENT DOCUMENTS

| | | | |
|---|---|---|---|
| 3,609,707 | 9/1971 | Lewis | 340/173 CC |
| 3,701,118 | 10/1972 | O'Conner | 340/173 CC |
| 3,896,420 | 7/1975 | Szabo | 340/173 CC |
| 3,940,748 | 2/1976 | Carson | 340/173 CC |

Primary Examiner—Terrell W. Fears
Attorney, Agent, or Firm—R. S. Sciascia; Philip Schneider; Thomas McDonnell

[57] ABSTRACT

A method of improving the holographic storage of data by yielding brighter holograms with higher densities which comprises recording an interferogram of an object wave and a reference wave into a holographically recordable medium consisting of an ionic crystal initially with a random distribution of anisotropic centers, and mutually off-set at an angle of at least $\sin^{-1} 10\lambda/d$ wherein $d$ is the crystal thickness and $\lambda$ the wavelength of the coherent source; and then consecutively exposing the crystal to the object wave and the reference wave, each with a $\pi/2$ rotation in the plane of polarization but without any change in light intensity, wavelength, or crystal temperature.

4 Claims, 6 Drawing Figures

EXTINCTION

L $L - |r_0|^2$ $L - |r_0|^2 - |a|^2$

METHOD FOR HOLOGRAPHIC STORAGE

BACKGROUND OF THE INVENTION

The invention pertains generally to data storage and in particular to holographic data-storage.

The increases in size and complexity of computers along with the increase in storage and data-processing requirements have created a need for fast, high-density write-read-erase memories with capacities exceeding $10^9$ bits and submicrosecond random-access times. By employing the three dimensionality and inherent parallel-processing capability of holography, a larger storage capacity is obtained without sacrificing access time. By contrast, conventional computers must be designed as a compromise where there is a trade-off between these two parameters.

Essentially holographic data storage is achieved by recording an interference pattern between a reference light wave and the object light wave scattered from a transparency on which data is recorded. Best results have only been obtained for off-axis arrangements of the reference and object waves, wherein a separation is achieved during holographic reconstruction of the virtual image which is usually the desired data plane from all other waves, i.e., the real image and the on-axis waves.

Unfortunately, holographic data storage is not without problems. These often include light scattering from the stored material, graininess of the storage medium, contamination of the data readout by noise introduced by interference with the on-axis transmissions of the hologram. The latter results in a trade-off between the readout size and the readout modulation of brightness.

SUMMARY OF THE INVENTION

Is is therefore an object of this invention to provide a method of holographically recording data.

Still another object of this invention is to provide recording medium which is free of defects arising from the graininess of the recording medium.

Another object is to provide such a recording method which eliminates light scattering from the medium and contamination of the data place by eliminating the on-axis waves of a reconstructed hologram.

These and other objects are achieved by a method of recording which comprises generating an interferogram of a reference wave and an object wave by an off-axis arrangement of the reference wave at an off-set angle which may be reduced to the point where the real image is Bragg suppressed, i.e., the off-set angle is only greater than $\sin^{-1} 10\lambda/d$ where $d$ is the crystal thickness; illuminating the interferogram onto a photodichroic, i.e., an alkali halide crystal containing anisotropic color centers, with a thickness greater than $10\lambda/\sin \theta$, thereby Bragg suppressing the real image on readout, and with an initial random distribution of anisotropic centers, thereby permitting the erasure of the on-axis waves; and exposing the medium to the original reference wave and object wave individually and in succession with a polarization rotated $\pi/2$ degrees relative to the record polarization, thereby eliminating the on-axis waves.

DETAILED DESCRIPTION OF THE INVENTION

Figure 1:
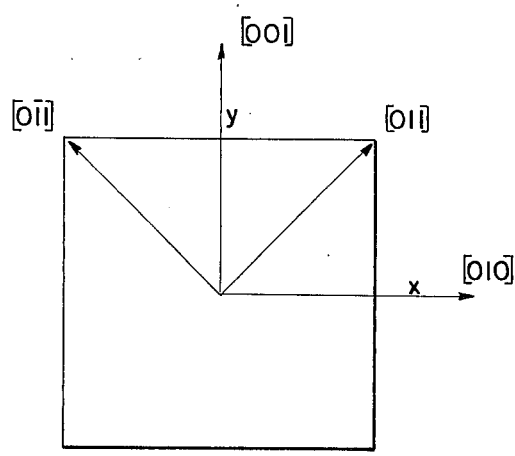
FIG. 1 is a schematic arrangement of a crystal and the polarization vectors used in recording and erasing holograms.
Figure 2:
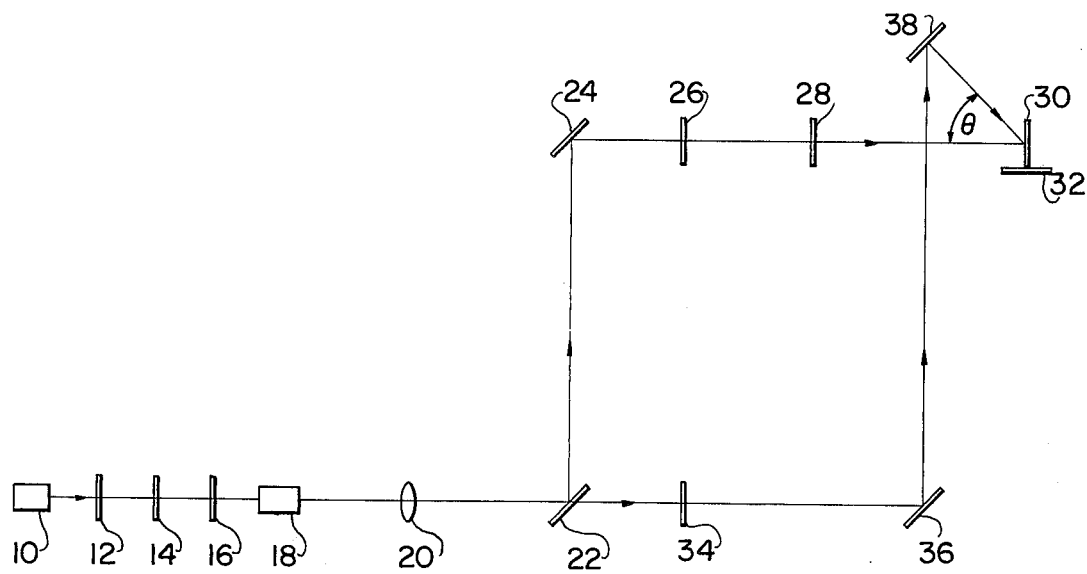
FIG. 2 is a schematic of the preferred apparatus arrangement for holographically recording data according to the method of this invention.

The mechanism by which the present invention achieves the above objects is explained with reference to FIGS. 1 and 2. FIG. 1 is a schematic of a crystal and the polarization vectors used in recording and erasing holograms. Propagation of all teams would be approximately along [100], i.e., out of the page. FIG. 2 is preferred arrangement for recording a halogram of an object wave represented as the function $a(x,y)$ and an off-axis plane wave as $R = r_o X\exp[-jky \sin \theta]$ wherein $r_o$ is a constant and K is the propagation constant, equal in magnitude to $2\pi/\lambda$ ($\lambda$ is the wavelength of the coherent light) and $\theta$ is the offset angle. The intensity distribution appearing across the x-y plane of the recording medium is given by the expression:

$$L = |R + a(x,y)|^2 = r_o^2 + |a(x,y)|^2 + r_o a(x,y)\exp[jky \sin \theta] + r_o a^*(x,y)\exp[-jky \sin \theta]$$

If the recording medium is relatively thin, i.e., with thickness, $d$, on the order of $10 \lambda/\sin \theta$ or less and subsequently has an amplitude transmittance $t$, proportional to L, then the field produced by an identical plane wave, is given by:

$$Rt_r = R[t_b = \beta L] = r_o[t_b + \beta r_o^2]\exp[-jky \sin \theta] + \beta r_o^2 |a(x,y)|^2 \exp[-jky \sin \theta] + \beta r_o a^*(x,y)\exp[-jky 2 \sin \theta] + \beta r_o 2 a(x,y)$$

wherein, $t_b$ is the bias amplitude transmittance of the recording medium and $\beta$ is a constant.

An analysis of the above equation shows the source of a key problem associated with holographic data storage. The $r_o(t_b + \beta r_o^2)$ term gives rise to an undeflected, attenuated plane wave and the $r_o|a(x,y)|^2$ term, to a diffracted, self-interference (autocorrelated) wave, each propagating along the direction of the reference beam. These two are referred to as the on-axis waves and contaminate the data-plane readout.

Previously, contamination of the readout was minimized by selecting an off-set angle $\theta$ so that $\theta \geq \sin^{-1} 3B\lambda$ where B is the maximum spatical frequency of the object wave. Such an angle would minimize the contamination by spatially isolating the autocorrelation term from both the virtual and real images. A reduction in off-set angle to $\sin^{-1} B\lambda$ can be achieved by choosing recording intensities so that $r_o^2 >> |a(x,y)|^2$ or suppressing the autocorrelation term. However, this technique is objectionable since readout noise is not completely removed and furthermore the decrease in off-set angle is achieved at the expense of image modulation or image brightness, i.e., diffraction efficiency. If it were possible to erase the $r_o(t_b + \beta r_o^2)$ term, the off-set angle could be reduced below $\sin^{-1} B$.

The other two terms involving $a(x,y)$ and i $a^*(x,y)$ represent the virtual and the real images, respectively.

If the holographic medium has a thickness at least an order of magnitude greater than the fringe spacing, δ, which is determined from the off-set angle θ, the real image is Bragg-suppressed. In practice, this could lead to a reduction in angle of less than 2° for crystals several mm thick.

Thus, if both on-axis waves are eliminated, the virtual image could be reconstructed alone from the thick storage medium. In other words, readout of stored data would occur without clutter and effectively with a brighter, and enlarged readout place.

In the preferred practice of this invention a modified Mach-Zehnder arrangement, shown schematically in FIG. 2, is used to holographically record data. A laser 10, such as the Helium-Neon, Argon and Krypton, operable at wavelengths which are absorbed by the antisotropic center of the recording medium, produces a wave of coherenet light at an absorbable wavelength which passes through shutter 12 or similiar means for optionally blocking the beam of light, through quarter wave plate 14 or similiar means to convert the linearly polarized laser light to circularly polarized light, and then through Pockel Cell 16 or similiar means for producing light of two mutually orthogonally linear polarization from the light exiting from quarter wave plate 14. This effect is accomplished by applying a quarter wave voltage from a d.c. power supply (not shown) to the Pockel Cell and simply reversing polarities. Upon exiting Pockel Cell 16, the light passes through spatial filter 18 or similiar means for improving this cross-sectional uniformity of the laser beam intensity, through beam expander lens 20 or similiar device for collimating the light, and then to beam splitter 22 which may be any splitter capable of handling the intensity of the light without deteriorating. The light is split in two, one half becoming the reference wave and the other half becoming the object wave.

The object wave proceeds to mirror 24 or similiar means for changing the direction of the light. This mirror and the other mirrors used herein have excellent optical flatness, i.e., one-tenth wave flatness or better in order to avoid distortingthe light waves. After mirror 24 the object wave passes through shutter 26 or similiar means for blocking the wave when desired, through object 28, and into crystal 30 which is mounted on the cold finger of an optical dewar 32. An example of a cooling element for the dewar 32 consists of a three stage thermoelectric device, which through thermal contact provides a vibration-free support with a variable-fixed temperature capability from −70° to 50° C.

The reference wave passes through beam splitter 22, and a shutter 34, which is similiar to shutters 12 and 26; to a mirror 36, to yet another mirror 38, and then to crystal 30 wherein it enters the crystal at an angle θ with respect to the object wave.

The recording medium is preferably a thick alkali halide crystal initially with randomly distributed anisotropic centers, particularly the $F_A$, M or $M_A$ centers. The preferred alkali halide crystals are potassium chloride, sodium fluoride and potassium fluoride and the preferred dopant for the impurity-associated anisotropic centers is any alkali metal ion of smaller size than that of the host crystal. Further information concerning these crystals and their preparation can be found in U.S. Pat. Nos. 3,580,688; 3,673,578; 3,720,926; 3,727,194; 3,771,150; 3,814,601 and 3,846,764 of Irwin Schneider. The preferred method for preparing alkali fluoride crystals is disclosed in U.S. Patent application Ser. No. 573,277 filed on Apr. 30, 1975 by Irwin Schneider et al. In addition to all the aforementioned advantages regarding the use of these materials in holograhic storage, these crystals provide an on-line read-write-erase storage capability, minimal fatigue, reasonable high writing sensitivity, a nondestructive read capability, thermal stability and diffraction-limited resolution.

A random distribution of anisotropic center for the practice of this invention is defined as one in which the anisotropic center concentration in each of the two front face directions of the crystal vary in concentration by no more than 2 percent of each other and each comprise from 10 to 50 percent of the total number of centers present in the crystal. The two front face directions of the crystal shown in FIG. 1 are [001] and [010]. The importance of the requirement of uniformity is shown by the following considerations.

Anisotropic centers behave in some repects like atomicsized dipoles which absorb light of a certain wavelength when the light has a component of polarization parallel to the dipole axis. The dipole axis for a particular center lies along one of several possible crystallographic directions depending upon the orientation of the center. Recording in crystals using these centers involves changing the direction of the dipole-like centers from one or more crystallographic direction to some other predetermined crystallographic direction or directions. Thus, the record mode for a particular crystal with a particular anisotropic center consists of irradiating the crystal with light having a wavelength equal to one of the absorption bands of the center and a polarization parallel to a specific dipole axis. Additional information on the mechanism of reorientation and the absorption bands of the anisotropic centers may be found in the aforementioned U.S. Patents of Irwin Schneider.

In reference to FIG. 1 the rate equations for recording with a light wave propagating along the z-direction [001] and polarized along [100] at a given segment of crystal are:

$$(dN_x/dT) \sim \eta L [N_y + N_z], (dN_y/dt) \sim \eta L [-N_y + N_z], (dN_z \sim \eta L [-N_z + N_y]$$

Where $N_x$, $N_y$ and $N_z$ are the concentration of centers with dipole axes along [100], [010] and [001], respectively, η is the reorientation efficiency and L is the light intensity. Erasure would be identical except for interchanging the x and y dependence. It follows that if the exposures are restricted so that the fractional changes in concentration remain relatively small during both record and erase, the difference, $N_x - N_y$, varies with Lt. As a result, erasure would linearly remove any part of the dichroic absorption (and birefringence) produced uring the recording. In particular, any crystal segment would be restored to its initial state for equal record and erase exposures.

These initial distributions are evidently also appropriate for eliminating the $r_o t_b$ term during reconstruction. The lightwould enter the crystal linearly polarized along [001] and pass through to an analyser oriented along [011]. Extinction would occur provided the centers are distributed in equal concentrations along [100] and [010]. However, transmission would occur if the combined effect of recording and erasure produces a net [100] dichroic absorption. Furthermore, if the dichroic absorption changes are relatively small, the transmitted light intensity would vary with $(N_x - N_y)^2$.

Thus, the amplitude transmittance during reconstruction would be proportional to the difference in record and erase intensity. As a result, less light would be wastefully diffracted into higher orders. Furthermore, this reconstruction geometry has the added virtue that light ordinarily scattered from the crystal largely maintains its incoming polarization and would be absorbed by the crossed polarizer.

Although the preferred arrangement is some type of modified Mach-Zehnder interferometer, any off-axis arrangement may be used provided the mutual coherence of the reference and object beams be maintained. This is accomplished by keeping the difference in the path lengths of the object and reference beams within the coherence length of the laser used. Similarly recording media other than alkali halide crystals may be used. What is required is that the medium exhibit photoinduced dichroism and birefringence and have a spatially selective erasure with the same simple, factorable dependence on light intensity in recording.

By way of illustration and further explanation, the following example and discussion is given. It is understood that the invention is not limited to the example but is susceptible to different modifications that would be recognized by one of ordinary skill in the art.

EXAMPLE I

A 3mm thick lithium-doped, additively colored KCl, crystal containing F centers was mounted in a thermoelectric dewar, cooled to $-20°$ C and exposed to unpolarized light in the spectral region of the F-band. This illumination converted all F-centers to $F_A$ centers, i.e., an F-center next to a substitutional $Li^+$ ion along a $<100>$ crystallographic direction. Such a center gives rise to two absorptions in the visible spectral region, one peaking near 635 nm (i.e., the $F_{A_1}$ band) with a dipole moment along the F center--impurity axis and one peaking at about 550 nm (i.e., the $F_{A_2}$ band) with dipole moment in the plane perpendicular to this axis. These centers reorient with light absorbed in either transition and can be preferentially aligned along a $<100>$ direction using linearly polarized light. The result if that $<100>$ dichroism appears in each band along with a corresponding amisotrophy in refractive index (i.e., birefringence).

The crystal was placed in the modified Mach-Zehnder arrangement shown in FIG. 2 with an off-set angle $\theta$ of approximately 10°. The 528.7 nm line of an Argon laser was used to generate the interferogram of the object wave and the reference wave and to erase the on-axis waves. The object wave was generated by light passing through a diffusing plate in contact with a negative transparency consisting of the letters NRL. The object and reference waves of approximately equal intensity at the crystal.

Holographic recording and erasing involved the reorientation of $F_a$ centers from one 100 direction by rotating the plane of polarization by $\pi/2$ radians. This was accomplished with the combination of Pockel Cell 16 and a ¼ plate used as polarizer 14. The reconstructed images were photographed using the same wavelength with the crystal located between crossed HN polaroids. The reconstructed images were photographed using the same wavelength with the crystal located between crossed HN polaroids. Because the wavelength chosen is read-destructive, the images were photographed with much shorter exposures (i.e., $\sim 1/10$ sec) than required to write or erase the holograms (i.e., several sc). Furthermore, since the polaroids used normally had a relatively large transmittance at extinction, the transmitted reference was attenuated so that the intensity at extinction was small compared to the holographically produced waves.

Figure 3A:
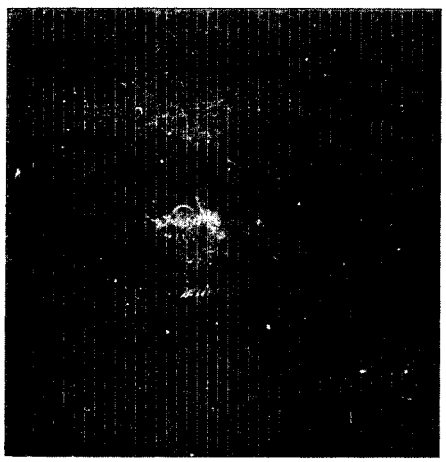
FIG. 3a is a picture of the readout before recording, showing the intensity transmitted initially for extinction.
Figure 3B:
FIG. 3b is a picture of a typical readout after recording the interferogram.
Figure 3C:
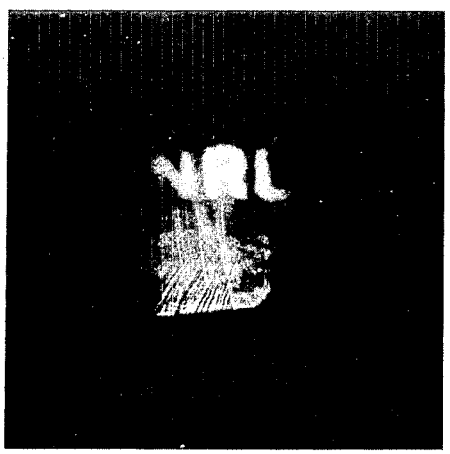
FIG. 3c is a picture of the above readout after erasure of the $r_o^2$ term.
Figure 3D:
FIG. 3d is a picture of the above readout after erasure of the $a^2$ term.

FIGS. 3a–d show a typical sequence of photographs taken of images produced by the hologram. FIG. 3a was photographed before recording the interferogram and shows the initial transmission level of the crystal between crossed polarizers. Photographs were then taken sequentially immediately after recording the interferogram (FIG. 3b), after erasure of the $r_o^2$ term by mechanically blocking the object wave (FIG. 3c) and after erasure of the $a^2$ term by mechanically blocking the reference wave (FIG. 3d). The erase exposures were equal to that used for recoding. These photographs clearly demonstrate the effectiveness of the method in removing the autocorrelation and reference waves. Elimination of the conjugate image leaving just the reconstructed wavefront occured here through Bragg suppression as a result of using the off-axis arrangement and a relatively thick crystal, i.e., 3.0 mm. In fact, with elimination of the autocorrelation wave, the remaining off-set requirement is simply that the medium by considered thick.

Obviously, many modifications and variations of the present invention are possible in light of the above teachings. It is therefore to be understood that, within the scope of the appended claims, the invention may be practiced otherwise than as specifically described.

What is claimed and desired to be secured by letters patent of the United States is:

1. A method for improving holographic storage which comprises:
   recording an interferogram of a reference wave and an object wave on the ionic crystal with a random distribution of anisotropic centers:
   beaming only said reference wave in the erase mode on the crystal; and
   beaming only said object wave in the erase mode on the crystal.

2. The method of claim 1 wherein said ionic crystal is an alkali halide crystal and said anisotropic centers are selected from the class consisting of $F_A$, M, and $M_A$ centers.

3. The method of claim 2 wherein said ionic crystal is selected from the class consisting of potassium chloride, sodium fluoride, and potassium fluoride.

4. The method of claim 3 wherein said ionic crystal has a thickness greater than $10\lambda/\sin \theta$.

* * * * *